United States Patent
Suh et al.

(10) Patent No.: US 9,704,789 B1
(45) Date of Patent: Jul. 11, 2017

(54) MOLDED INTELLIGENT POWER MODULE

(71) Applicant: Alpha and Omega Semiconductor (Cayman) Ltd., Sunnyvale, CA (US)

(72) Inventors: Bum-Seok Suh, Seongnam (KR); Zhiqiang Niu, Santa Clara, CA (US); Wonjin Cho, Suwon-si (KR); Cheow Khoon Oh, The Hacienda (SG); Son Tran, San Jose, CA (US); James Rachana Bou, Long Beach, CA (US)

(73) Assignee: ALPHA AND OMEGA SEMICONDUCTOR (CAYMAN) LTD., Sunnyvale, CA (US)

( * ) Notice: Subject to any disclaimer, the term of this patent is extended or adjusted under 35 U.S.C. 154(b) by 0 days.

(21) Appl. No.: 15/294,766

(22) Filed: Oct. 16, 2016

(51) Int. Cl.
   *H01L 23/495* (2006.01)
   *H01L 23/31* (2006.01)
   *H01L 27/06* (2006.01)
   *H02P 27/00* (2006.01)

(52) U.S. Cl.
   CPC .... *H01L 23/49575* (2013.01); *H01L 23/3114* (2013.01); *H01L 23/4952* (2013.01); *H01L 23/49537* (2013.01); *H01L 23/49555* (2013.01); *H01L 27/0629* (2013.01); *H02P 27/00* (2013.01)

(58) Field of Classification Search
   CPC ....... H01L 2924/00; H01L 2924/00014; H01L 2224/48227; H01L 2224/73265; H01L 2924/00012; H01L 2224/32225; H01L 2224/48247; H01L 2924/181; H01L 2224/48465; H01L 2924/0002; H01L 2224/45099
   See application file for complete search history.

(56) References Cited

U.S. PATENT DOCUMENTS

| D505,400 S | 5/2005 | Kawafuji et al. |
|---|---|---|
| 7,952,317 B2 | 5/2011 | Suh |
| 2003/0107120 A1 | 6/2003 | Connah et al. |

*Primary Examiner* — Robert Bachner
(74) *Attorney, Agent, or Firm* — Chen-Chi Lin

(57) ABSTRACT

An intelligent power module (IPM) has a first, second, third and fourth die paddles, a first, second, third, fourth, fifth and sixth transistors, a tie bar, a low voltage IC, a high voltage IC, a first, second and third boost diodes, a plurality of leads and a molding encapsulation. The first transistor is attached to the first die paddle. The second transistor is attached to the second die paddle. The third transistor is attached to the third die paddle. The fourth, fifth and sixth transistor s are attached to the fourth die paddle. The low and high voltage ICs are attached to the tie bar. The molding encapsulation encloses the first, second, third and fourth die paddles, the first, second, third, fourth, fifth and sixth transistors, the tie bar, the low and high voltage ICs, and the first, second and third boost diodes. The IPM has a reduced top surface area and a reduced number of leads compared to a conventional IPM.

15 Claims, 4 Drawing Sheets

MOLDED INTELLIGENT POWER MODULE

FIELD OF THE INVENTION

This invention relates generally to a molded intelligent power module (IPM) for driving a motor. More particularly, the present invention relates to a molded IPM having a reduced top surface area and a reduced number of leads compared to a conventional IPM.

BACKGROUND OF THE INVENTION

A conventional IPM uses an insulated metal substrate (IMS). The IMS is usually clamped by two copper layers. In the present disclosure, the use of lead frame and die paddles in an over-mold type IPM simplifies the manufacturing process and reduces the fabrication cost. A conventional IPM for driving a motor has three driving integrated circuits (ICs). In the present disclosure, the IPM has a low voltage IC and a high voltage IC.

Compact package size is achieved by optimization of the layout. The optimization includes use of two driving ICs instead of three driving ICS and introduction of conformal curved sides along adjacent die paddles. Reduction of the number of leads is achieved by attaching the two driving ICs on a same tie bar and wire-bonding three boost diodes to a selected lead connected to a power supply pin.

SUMMARY OF THE INVENTION

The present invention discloses an IPM having a first, second, third and fourth die paddles, a first, second, third, fourth, fifth and sixth metal-oxide-semiconductor field-effect transistors (MOSFETs), a tie bar, a low voltage IC, a high voltage IC, a first, second and third boost diodes, a plurality of leads and a molding encapsulation. The first MOSFET is attached to the first die paddle. The second MOSFET is attached to the second die paddle. The third MOSFET is attached to the third die paddle. The fourth, fifth and sixth MOSFETs are attached to the fourth die paddle. The low and high voltage ICs are attached to the tie bar. The molding encapsulation encloses the first, second, third and fourth die paddles, the first, second, third, fourth, fifth and sixth MOSFETs, the tie bar, the low and high voltage ICs, and the first, second and third boost diodes.

At least four through holes are located along a trench separating the tie bar and the first, second, third and fourth die paddles. The at least four through holes are between a middle section of a lower side edge of the tie bar and upper side edges of the first, second, third and fourth die paddles. Through holes help to reduce moisture formation. The at least four through holes are configured to receive at least four supporting pins during a molding process.

DETAILED DESCRIPTION OF THE INVENTION

Figure 1:
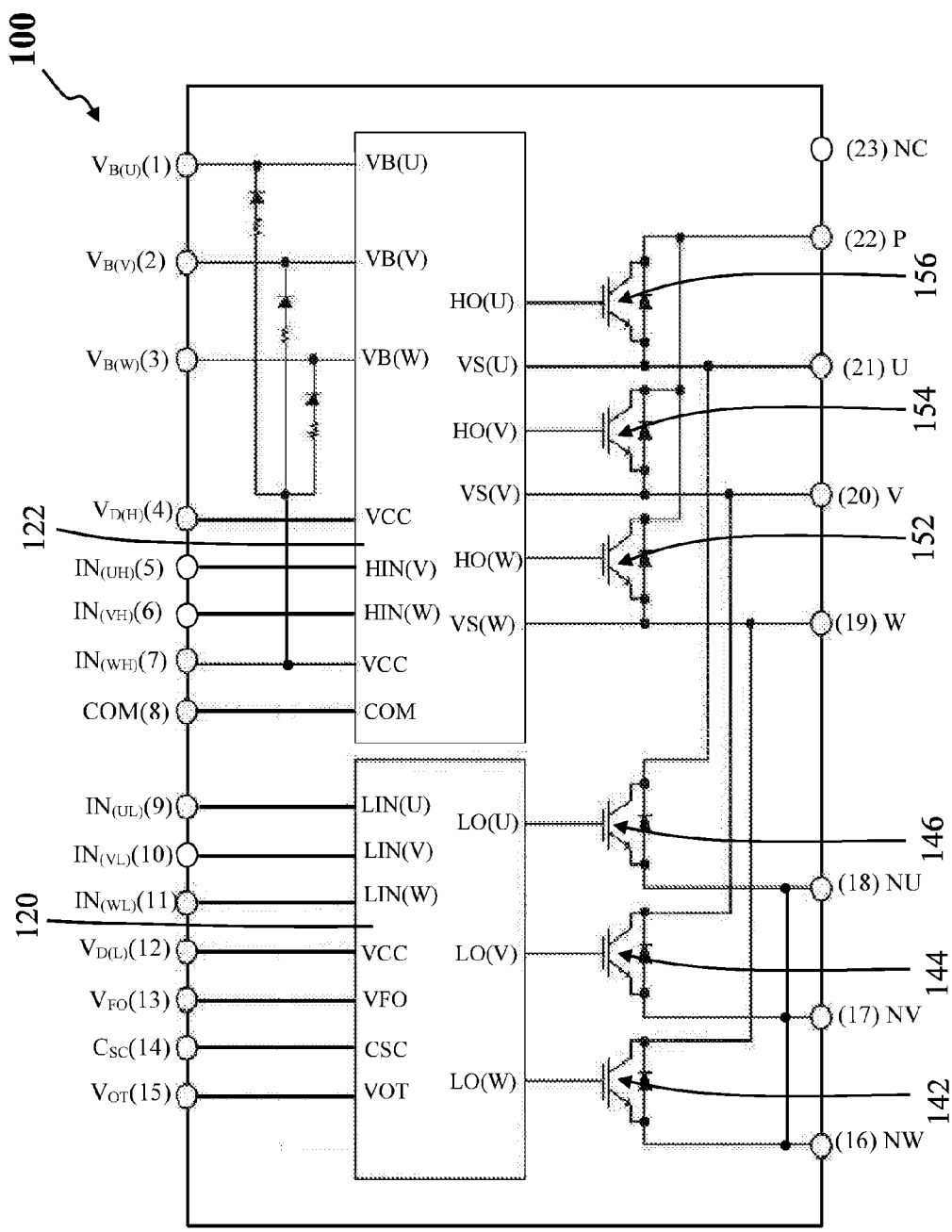
FIG. 1 is a circuit diagram of an intelligent power module (IPM) for driving a motor in examples of the present disclosure.

FIG. 1 is a circuit diagram 100 of an IPM for driving a motor in examples of the present disclosure. A low voltage integrated circuit (IC) 120 controls a first transistor 142, a second transistor 144 and a third transistor 146. A high voltage IC 122 controls a fourth transistor 152, a fifth transistor 154 and a sixth transistor 156. In examples of the present disclosure, the transistors are metal-oxide-semiconductor field-effect transistors.

Figure 2:
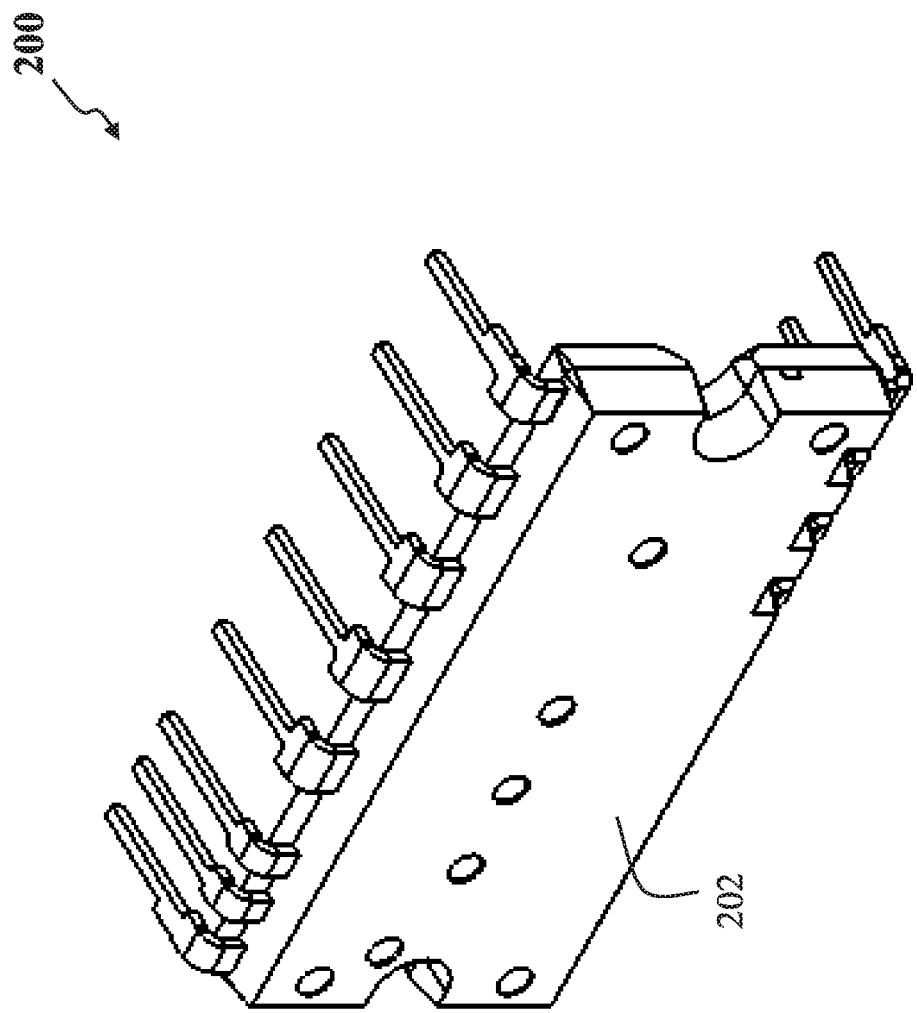
FIG. 2 is a perspective view of an IPM in examples of the present disclosure.

FIG. 2 is a perspective view of an IPM 200 in examples of the present disclosure. In one example, a top surface area 202 of the IPM 200 is at most 500 square millimeters. A top surface area of a conventional IPM is about 750 square millimeters.

Figure 3:
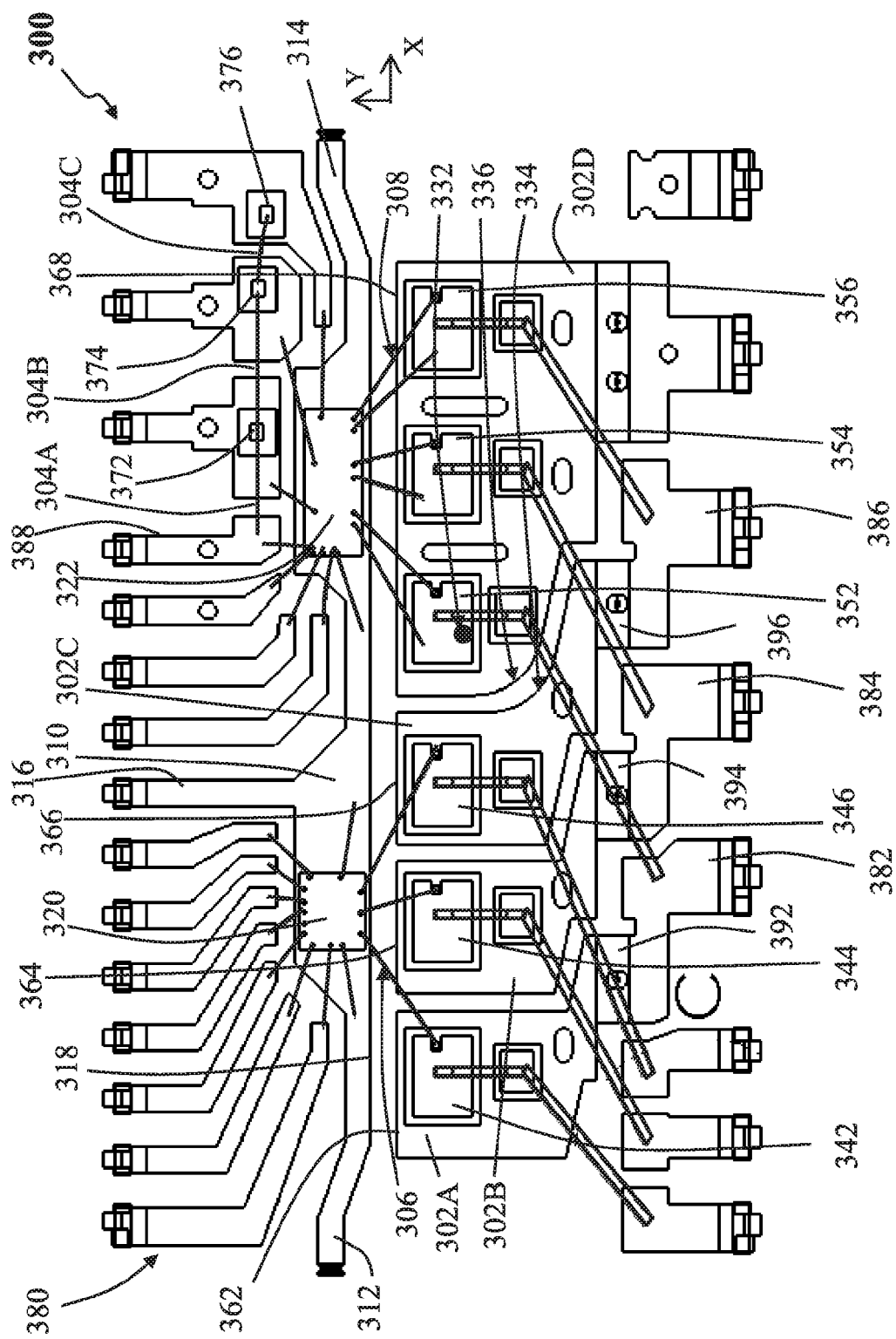
FIG. 3 is a bottom view of an IPM (with a molding encapsulation not shown) in examples of the present disclosure.

FIG. 3 is a bottom view of an IPM 300 (with a molding encapsulation 498 of FIG. 4A not shown) in examples of the present disclosure. The IPM 300 has a first die paddle 302A, a second die paddle 302B, a third die paddle 302C, a fourth die paddle 302D, a first transistor 342, a second transistor 344, a third transistor 346, a fourth transistor 352, a fifth transistor 354, a sixth transistor 356, a tie bar 310, a low voltage IC 320, a high voltage IC 322, a first boost diode 372, a second boost diode 374, a third boost diode 376, a plurality of leads 380 and a molding encapsulation 498 of FIG. 4A.

The first die paddle 302A, the second die paddle 302B, the third die paddle 302C, and the fourth die paddle 302D are separated from each other and arranged one by one next each other in sequence with one edge of each die paddle aligned substantially in a line. The first transistor 342 is attached to the first die paddle 302A. The second transistor 344 is attached to the second die paddle 302B. The third transistor 346 is attached to the third die paddle 302C. The fourth transistor 352, the fifth transistor 354 and the sixth transistor 356 are attached to the fourth die paddle 302D.

The tie bar 310 extends along the aligned edges of the die paddles. A first end 312 of the tie bar 310 extends beyond an outer edge of the first die paddle 302A. A second end 314 of the tie bar 310 extends beyond an outer edge of the fourth die paddle 302D. In examples of the present disclosure, the tie bar 310 further includes a mid-range extension 316 between the first end 312 and the second end 314. The mid-range extension 316 of the tie bar 310 is mechanically and electrically connected to a ground pin. The mid-range extension 316 extends along a lateral direction (Y-direction) perpendicular to aligned edges of the die paddles. The low voltage IC 320 is attached to a first expansion area of the tie bar 310 between the first end 312 and the mid-range extension 316 adjacent the second die paddle 302B. In examples of the present disclosure, the low voltage IC 320 is electrically connected to the first transistor 342, the second transistor 344 and the third transistor 346 by bonding wires 306. The high voltage IC 322 is attached to a second expansion area of the tie bar 310 between the second end 314 and the mid-range extension 316 adjacent the fourth die paddle 302D. In examples of the present disclosure, the high voltage IC 322 is electrically connected to the fourth transistor 352, the fifth transistor 354 and the sixth transistor 356 by bonding wires 308.

Figure 4B:
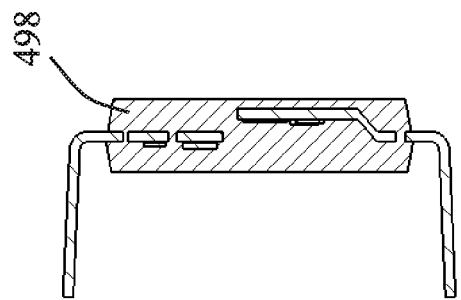
FIG. 4B is a cross-sectional view perpendicular to AA plane and FIG. 4C is a side view of an IPM in examples of the present disclosure.
Figure 4A:
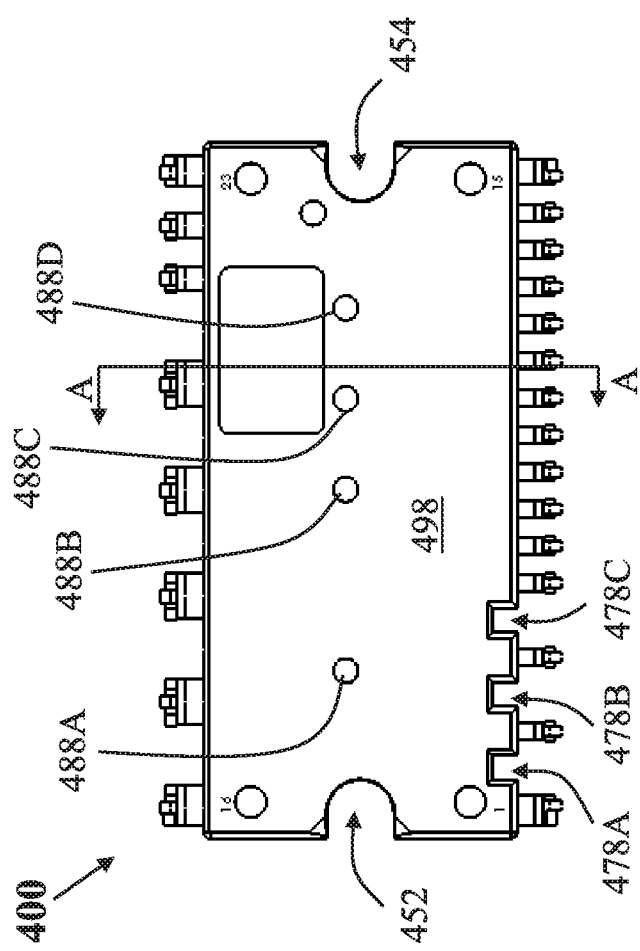
FIG. 4A is a top view.

In examples of the present disclosure, the molding encapsulation 498 of FIG. 4A encloses the first die paddle 302A, the second die paddle 302B, the third die paddle 302C, the fourth die paddle 302D, the first transistor 342, the second transistor 344, the third transistor 346, the fourth transistor 352, the fifth transistor 354, the sixth transistor 356, the tie bar 310, the low voltage IC 320, the high voltage IC 322, the first boost diode 372, the second boost diode 374 and the third boost diode 376. In examples of the present disclosure, the plurality of leads 380 are partially embedded in the molding encapsulation 498 of FIG. 4A. In examples of the present disclosure, end surfaces of the first end 312 and the second end 314 of the tie bar 310 are exposed from edge surfaces of the molding encapsulation 498.

In examples of the present disclosure, upper side edges 362, 364, 366 and 368 of the first die paddle 302A, the second die paddle 302B, the third die paddle 302C and the fourth die paddle 302D are aligned. A middle section 318 of a lower side edge of the tie bar 310 is parallel to the upper side edges 362, 364, 366 and 368. At least four through holes 488A, 488B, 488C and 488D of FIG. 4A are between the middle section 318 of the lower side edge of the tie bar 310 and the upper side edges 362, 364, 366 and 368 of the first die paddle 302A, the second die paddle 302B, the third die paddle 302C and the fourth die paddle 302D. The at least four through holes 488A, 488B, 488C and 488D of FIG. 4A are aligned along a longitudinal direction (X-direction). The at least four through holes 488A, 488B, 488C and 488D of FIG. 4A are configured to receive at least four supporting pins during a molding process.

In examples of the present disclosure, a first bonding wire 304A connects the first boost diode 372 to an adjacent lead 388 of the plurality of leads 380. A second bonding wire 304B connects the second boost diode 374 to the first boost diode 372. A third bonding wire 304C connects the third boost diode 376 to the second boost diode 374. In examples of the present disclosure, the adjacent lead 388 of the plurality of leads 380 is a power supply (Vcc) pin.

In examples of the present disclosure, a first curved side 334 of the third die paddle 302C and a second curved side 336 of the fourth die paddle 302D have a same center of curvature 332. A radius of curvature of the first curved side 334 is larger than a radius of curvature of the second curved side 336.

A first connecting member 392 connects the first die paddle 302A to a first lead 382 of the plurality of leads 380. A second connecting member 394 connects the second die paddle 302B to a second lead 384 of the plurality of leads 380. A third connecting member 396 connects the third die paddle 302C to a third lead 386 of the plurality of leads 380. The first connecting member 392, the second connecting member 394 and the third connecting member 396 have a same width. In examples of the present disclosure, the same width is at least 1.2 millimeters. A width of a conventional connecting member is in the range from 0.7 millimeters to 0.8 millimeters. A wider connecting member provides stronger mechanical support, increases electrical current capability by reducing resistance, and increases heat dissipation.

In examples of the present disclosure, a total number of leads of the plurality of leads 380 is at most 23. A total number of leads of a conventional IPM is at least 26.

Figure 4C:
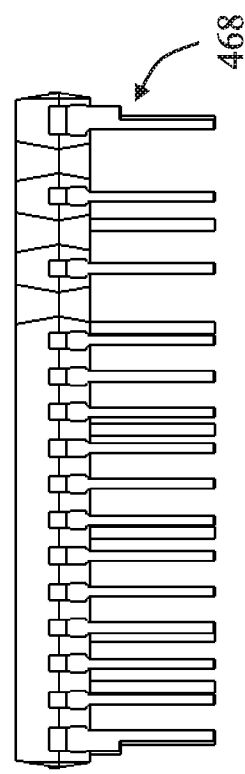

FIG. 4A is a top view, FIG. 4B is a cross-sectional view perpendicular to AA plane and FIG. 4C is a side view of an IPM 400 in examples of the present disclosure. Through holes 488A, 488B, 488C and 488D help to reduce moisture formation.

In examples of the present disclosure, the molding encapsulation 498 has a first cutout 452 near the first end 312 of the tie bar 310 and a second cutout 454 near the second end 314 of the tie bar 310. The first and second cutouts 452 and 454 are for screw mounts. In examples of the present disclosure, the first and second cutouts 452 and 454 are of half circular shapes.

In examples of the present disclosure, the molding encapsulation 498 has isolation cutouts 478A, 478B and 478C near the first boost diode 372, the second boost diode 374 and the third boost diode 376.

In examples of the present disclosure, at least two selected leads 468 of the plurality of leads 380 of FIG. 3 have rectangular cutouts so as to serve as lead stoppers.

Those of ordinary skill in the art may recognize that modifications of the embodiments disclosed herein are possible. For example, a total number of the selected leads 468 having rectangular cutouts may vary. Other modifications may occur to those of ordinary skill in this art, and all such modifications are deemed to fall within the purview of the present invention, as defined by the claims.

The invention claimed is:

1. An intelligent power module (IPM) for driving a motor, the IPM comprising:
    a first, second, third and fourth die paddles;
    a first transistor attached to the first die paddle;
    a second transistor attached to the second die paddle;
    a third transistor attached to the third die paddle;
    a fourth, fifth, and sixth transistors attached to the fourth die paddle;
    a tie bar having a first end, a second end and a mid-range extension;
    a low voltage integrated circuit (IC) attached to the tie bar; the low voltage IC being electrically connected to the first, second and third transistors;
    a high voltage IC attached to the tie bar, the high voltage IC being electrically connected to the fourth, fifth, and sixth transistors;
    a first, second and third boost diodes;
    a plurality of leads; and
    a molding encapsulation enclosing the first, second, third, and fourth die paddles, the first, second, third, fourth, fifth, and sixth transistors, the tie bar, the low voltage IC, the high voltage IC and the first, second and third boost diodes;
    wherein the plurality of leads are partially embedded in the molding encapsulation.

2. The IPM of claim 1, wherein the molding encapsulation has a first cutout near the first end of the tie bar and a second cutout near the second end of the tie bar.

3. The IPM of claim 1, wherein the molding encapsulation has isolation cutouts near the first, second and third boost diodes.

4. The IPM of claim 1, wherein the mid-range extension of the tie bar is mechanically and electrically connected to a ground pin.

5. The IPM of claim 1, wherein upper side edges of the first, second, third, and fourth die paddles are co-planar;
    wherein a middle section of a lower side edge of the tie bar is parallel to the upper side edges of the first, second, third, and fourth die paddles;
    wherein at least four through holes are between the middle section of the lower side edge of the tie bar and the upper side edges of the first, second, third, and fourth die paddles and
    wherein the at least four through holes are aligned along a longitudinal direction.

6. The IPM of claim 5, wherein the at least four through holes are configured to receive at least four supporting pins during a molding process.

7. The IPM of claim 1, wherein the low voltage IC is electrically connected to the first, second and third transistors by a plurality of bonding wires.

8. The IPM of claim 1, wherein the high voltage IC is electrically connected to the fourth, fifth, and sixth transistors by a plurality of bonding wires.

9. The IPM of claim 1, wherein a first bonding wire connects the first boost diode to an adjacent lead of the plurality of leads;
   wherein a second bonding wire connects the second boost diode to the first boost diode; and
   wherein a third bonding wire connects the third boost diode to the second boost diode.

10. The IPM of claim 9, the adjacent lead of the plurality of leads is mechanically and electrically connected to a power supply (Vcc) pin.

11. The IPM of claim 1, wherein at least two selected leads of the plurality of leads have rectangular cutouts so as to serve as lead stoppers.

12. The IPM of claim 1, wherein a first curved side of the third die paddle and a second curved side of the fourth die paddle have a same center of curvature and wherein a radius of curvature of the first curved side is larger than a radius of curvature of the second curved side.

13. The IPM of claim 1, wherein a first connecting member connects the first die paddle to a first lead of the plurality of leads;
   wherein a second connecting member connects the second die paddle to a second lead of the plurality of leads;
   wherein a third connecting member connects the third die paddle to a third lead of the plurality of leads; and
   wherein the first, second and third connecting members have a same width.

14. The IPM of claim 1, wherein the low voltage IC and the high voltage IC are directly attached to the tie bar and wherein the IPM excludes another IC directly attached to the tie bar.

15. The IPM of claim 1, wherein the first transistor is a first metal-oxide-semiconductor field-effect transistor (MOSFET);
   the second transistor is a second MOSFET;
   the third transistor is a third MOSFET;
   the fourth transistor is a fourth MOSFET;
   the fifth transistor is a fifth MOSFET; and
   the sixth transistor is a sixth MOSFET.

* * * * *